United States Patent
Bostanjoglo et al.

(10) Patent No.: US 7,690,112 B2
(45) Date of Patent: Apr. 6, 2010

(54) PROCESS AND APPARATUS FOR PRODUCING A TURBINE COMPONENT, TURBINE COMPONENT AND USE OF THE APPARATUS

(75) Inventors: Georg Bostanjoglo, Berlin (DE); Nigel-Philip Cox, Berlin (DE); Rolf Wilkenhöner, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 1431 days.

(21) Appl. No.: 10/794,459

(22) Filed: Mar. 5, 2004

(65) Prior Publication Data

US 2005/0005444 A1    Jan. 13, 2005

(30) Foreign Application Priority Data

Mar. 25, 2003   (EP)   ................... 03006650

(51) Int. Cl.
*B21D 53/78* (2006.01)
*B21K 3/04* (2006.01)
*B23P 15/04* (2006.01)

(52) U.S. Cl. .................. 29/889.7; 29/423; 29/527.1; 416/223 R

(58) Field of Classification Search .......... 29/889.1, 29/889.7, 423, 424, 527.1, 527.2; 164/332; 416/223 R
See application file for complete search history.

(56) References Cited

U.S. PATENT DOCUMENTS

| | | | | |
|---|---|---|---|---|
| 3,542,120 A * | 11/1970 | Piearcey | ................ | 164/361 |
| 3,741,824 A * | 6/1973 | Duvall et al. | ................ | 148/527 |
| 3,986,868 A * | 10/1976 | Crossley | ................ | 420/419 |
| 4,049,436 A * | 9/1977 | von Scheele | ................ | 75/255 |
| 4,637,448 A * | 1/1987 | Burke et al. | ................ | 164/122.2 |
| 4,717,536 A * | 1/1988 | Chai et al. | ................ | 420/103 |
| 4,896,408 A * | 1/1990 | Fraser | ................ | 29/889.1 |
| 5,261,480 A * | 11/1993 | Wortmann et al. | ................ | 164/256 |
| 5,512,241 A * | 4/1996 | Kramer et al. | ................ | 420/528 |
| 5,778,960 A * | 7/1998 | Jackson et al. | ................ | 164/98 |
| 6,024,792 A | 2/2000 | Kurz et al. | | |
| 6,277,500 B1 * | 8/2001 | Konter et al. | ................ | 428/615 |
| 6,325,871 B1 | 12/2001 | Burke et al. | | |
| 6,331,217 B1 | 12/2001 | Burke et al. | | |
| 6,405,435 B1 * | 6/2002 | Konter et al. | ................ | 29/889.7 |
| 6,845,900 B2 * | 1/2005 | Fairchild et al. | ................ | 228/165 |
| 6,872,912 B1 * | 3/2005 | Wos et al. | ................ | 219/121.64 |
| 6,902,617 B2 * | 6/2005 | Betz | ................ | 117/9 |

(Continued)

FOREIGN PATENT DOCUMENTS

DE    3627764    * 2/1988

(Continued)

*Primary Examiner*—Essama Omgba

(57) ABSTRACT

Process and apparatus for producing a turbine component, turbine component and use of the apparatus Turbine components have to withstand high thermal and mechanical loads. It therefore proves advantageous for them to be made from a material with a preferred crystal orientation. Hitherto, the turbine components with a preferred crystal orientation have been produced as a single piece, with relatively high scrap rates. The proposed concept makes it possible to produce a preferred turbine component (9, 10) in a particularly simple way by assembling a turbine component (9, 10) at least from a first base part (1) and a build-up material (8), the subregion (7) of the joining zone having a preferred crystal orientation (2), so that disadvantageous properties of a joining zone without a preferred crystal orientation (2) which have hitherto been encountered are avoided.

7 Claims, 1 Drawing Sheet

U.S. PATENT DOCUMENTS

| | | | |
|---|---|---|---|
| 6,932,865 B2 * | 8/2005 | Brice ........................... | 117/40 |
| 6,998,568 B2 * | 2/2006 | Brehm et al. .......... | 219/121.62 |
| 7,226,493 B2 * | 6/2007 | Grong et al. ................... | 75/255 |
| 2003/0127431 A1 * | 7/2003 | Pratt et al. ................ | 219/76.11 |
| 2005/0103406 A1 * | 5/2005 | Zhao et al. ................... | 148/535 |
| 2006/0185791 A1 * | 8/2006 | Katayama et al. ........ | 156/272.8 |
| 2006/0277753 A1 * | 12/2006 | Ntsama-Etoundi et al. . | 29/889.1 |

FOREIGN PATENT DOCUMENTS

| EP | 0 815 993 A1 | | 1/1998 |
|---|---|---|---|
| JP | 2000-263247 | * | 9/2000 |
| JP | 2001-269784 | * | 10/2001 |
| WO | WO 99/21680 | | 5/1999 |

* cited by examiner

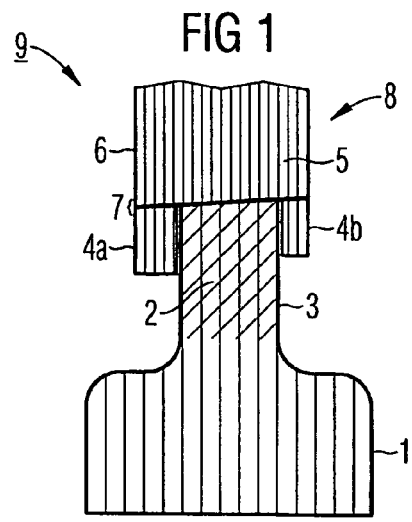
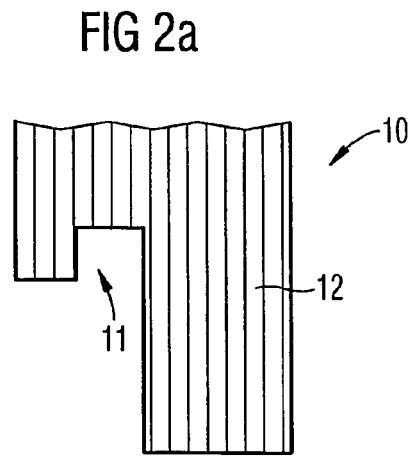
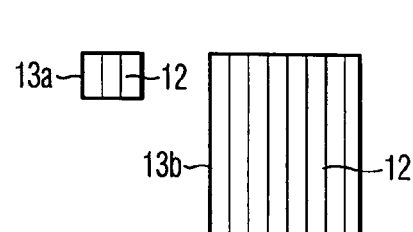
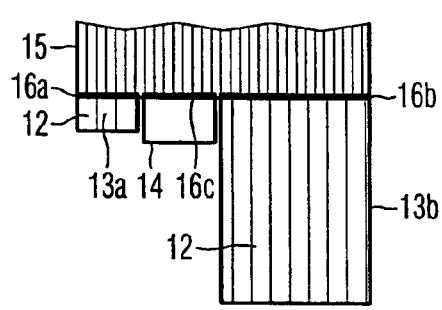
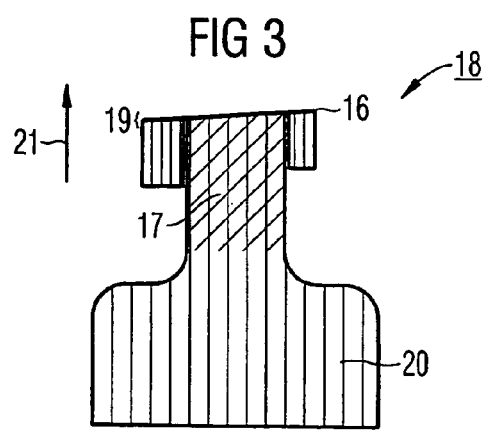

PROCESS AND APPARATUS FOR PRODUCING A TURBINE COMPONENT, TURBINE COMPONENT AND USE OF THE APPARATUS

CROSS REFERENCE TO RELATED APPLICATION

This application claims priority of the European application No. 03006550.0 EP filed Mar. 25, 2003 under the European Patent Convention and which is incorporated by reference herein in its entirety.

FIELD OF INVENTION

The invention relates to a process for producing a turbine component, at least comprising a base part and build-up material, including the following steps: provision of the base part, application of the build-up material to the base part, conversion of the build-up material, at least in a subregion which adjoins the base part, from a first state into a solid second state. Furthermore, the invention relates to an apparatus for producing a turbine component at least comprising a base part and build-up material, including: a holder for providing the base part, an application device for applying the build-up material to the base part, and for converting the build-up material from a first state into a solid second state at least in a subregion which adjoins the base part. The invention also leads to a use of the apparatus and to a turbine component.

BACKGROUND OF INVENTION

U.S. Pat. No. 6,024,792 shows the build-up welding used for single crystal structures, in which new layers are produced on a substrate by means of powder being supplied.

Turbines are used in many sectors to drive generators or turbo machines. The energy content of a working medium which is under a high pressure and at a high temperature is used to generate a rotary motion of a turbine shaft by the working medium being passed over the turbine, where it expands in such a manner as to perform work. To generate the rotary motion of the turbine shaft, a number of rotor blades, which are usually combined in ring form to form groups or rows of blades, are arranged over the outer circumference of the shaft, which rotor blades drive the turbine shaft by transfer of momentum from the working medium flowing in. Moreover, rows of guide vanes which are connected to the turbine casing are usually arranged between the adjacent rows of rotor blades in order to guide the flowing working medium in the turbine. The turbine blades and vanes have a main blade or vane section which is profiled in a manner which is advantageous for appropriate guidance of the working medium, is configured appropriately for the working medium parameters, such as pressure and temperature, and extends along a blade or vane axis. A platform, which extends transversely with respect to the blade or vane axis and is formed as a hook pedestal at least in an end region, is formed integrally on the end side of the main blade or vane part in order to attach the turbine blade or vane to its corresponding support, i.e. the shaft or casing.

To achieve a particularly high level of efficiency, gas or steam turbines for driving generators are for thermodynamic reasons designed for particularly high parameters of the working medium flowing into the turbine unit. In the case of steam turbines, this may quite easily mean pressures of over 200 bar and temperatures of over 500° C.

In the case of gas turbines, the temperatures of the working medium flowing into the turbine unit may lie in the range from approximately 1200° C. to approximately 1300° C.

To ensure a high level of reliability and a long service life of a turbine component, in particular a blade or vane, even at very high working medium parameters and correspondingly high thermal loads, turbine components which are exposed to particularly high levels of loading are designed to be coolable.

Furthermore, rotating turbine components are exposed to particularly high mechanical loads in the radial direction. For example, turbine blades or vanes generally have their axis orientated in the radial direction and have to withstand considerable tensile stresses in this direction. The mechanical loads are increased still further since, in modern turbines, the turbine blades or vanes are usually designed as what are known as hollow profiles, in order to ensure cooling of a turbine blade or vane in the inner region by acting on cavities in regions which are exposed to particularly high thermal loads. It has proven expedient to produce a turbine component from a material which has a preferred crystal orientation. For this purpose, the turbine component may be designed as a single crystal component, i.e. the preferred crystal orientation is given by the single crystal structure. A component of this type is also known as an "SX component". Alternatively, however, the preferred crystal orientation may also be produced by the turbine component being designed with a directionally solidified structure. A component of this type is also known as a "DS component". The preferred crystal orientation of the material of the turbine component makes it possible to achieve a particularly good, specifically directed and rapid, dissipation of heat and an ability to withstand tensile loads along the preferred crystal orientation which is considerably higher than with a turbine component made from a material which is isotropic. In the case of a turbine blade or vane, the preferred crystal orientation is expediently arranged along the blade or vane axis. The heat conduction properties of a turbine blade or vane of this type and its ability to withstand tensile loads are therefore particularly expedient along this preferred crystal orientation for operation of the turbine blade or vane in a turbine. Similar measures can also be provided in a similar way for other turbine components.

Turbine components which are exposed to considerable mechanical and thermal loads, in particular turbine blades or vanes, are usually produced entirely or in part, as described in EP 0 815 993 A1, using a casting process which enables the turbine component to be provided with a directionally solidified and/or single crystal structure as a preferred crystal orientation. Therefore, SX or DS blades or vanes are usually cast in a single operation. The casting process means that undercuts, as are used in particular in the case of the turbine blades or vanes with an anchoring platform or cavities as explained above, cannot be achieved or can only be achieved with difficulty. In any event, complex geometries generally lead to high scrap rates, which reduces the economic viability of the casting operation, which has to produce a turbine component of this type as a single component. Hitherto, these high scrap rates have been accepted. One attempt to lower scrap rates in a turbine component with a preferred crystal orientation, in particular in an SX and/or DS turbine component, consists in designing a turbine component of this type such that it is "suitable for casting", i.e. generally with simpler design than was originally desired. This is often to the detriment of the use properties of a turbine component of this type.

To summarize, therefore, it can be concluded that turbine components, in particular rotating components, which are exposed to high thermal and mechanical loads and at the same time have a design which is complex with regard to the casting operation can only be produced with difficulty with a preferred crystal orientation in the casting process. Either high scrap rates have to be accepted or a turbine component design which has been unnecessarily simplified purely for the casting operation has to be accepted. These problems are all the more serious since hitherto a single-crystal or directionally solidified turbine component has had to be cast as a single part using a casting process.

SUMMARY OF INVENTION

This forms the starting point for the invention, the object of which is to provide a process and an apparatus for producing a turbine component, a use of the apparatus and a turbine component, so that the turbine component, despite having a potentially complex structure, can be produced in a particularly simple way and with the minimum possible scrap rate.

With regard to the process for producing the turbine component, the object is achieved by the invention by means of a process of the type described in the introduction in which, according to the invention, while the build-up material is being converted at least in the subregion a preferred crystal orientation is initiated by a separate nucleating agent, so that after the conversion step the build-up material has the preferred crystal orientation in the solid second state at least in the subregion.

In terms of the apparatus, the object is achieved by the invention by means of an apparatus of the type described in the introduction in which, according to the invention, a separate nucleating agent is provided, so that during the conversion step a preferred crystal orientation is initiated in the build-up material by the nucleating agent at least in the subregion, so that after the conversion step the build-up material, in the solid, second state, has the preferred crystal orientation at least in the subregion.

In this context, the invention is based on the consideration that the turbine blade or vane should be designed in single crystal form for it to function particularly well, in particular in terms of thermal and mechanical properties, but does not necessarily have to be produced as a single part during a single casting operation. Instead, the invention provides for a turbine component substantially to be assembled from a base part and a build-up material. The crucial factor is that with the concept of the invention it is ensured that at least the subregion of the turbine component which is arranged as a joining region between the base part and the build-up material of the turbine component has a preferred crystal orientation. In this context, the invention is based on the discovery that during the conversion step a preferred crystal orientation is initiated in the build-up material by means of a nucleating agent at least in the subregion of the joining zone, so that thermally and mechanically disadvantageous properties of a joining zone without a preferred crystal orientation which have hitherto been accepted are avoided. The one base part or further auxiliary base parts of one of the turbine components could be removed again to complete the turbine component. For production of a turbine component which is completely provided with a preferred crystal orientation, the build-up material of the turbine component also has a preferred crystal orientation beyond the subregion.

On account of the use of the separate nucleating agent, it is also possible to subsequently recycle or reuse a starting part, which is not actually in single crystal form, or a starting part with a damaged crystal structure. The proposed concept of the invention for the first time allows particularly economical production of even complex turbine components with a preferred crystal orientation, since the subregion also has the preferred crystal orientation. Simply combining parts which each have a preferred crystal orientation would be disadvantageous, since with conventional joining processes the subregion of a joining zone does not have a preferred crystal orientation and therefore would not provide the abovementioned advantageous thermal and mechanical properties for a turbine component. By contrast, the concept of the invention allows turbine components which are completely provided with a preferred crystal orientation to be assembled, joined together or cast together, with even the subregion of the joining zone having the preferred crystal orientation. In this context, the invention makes use of the physical principle of nucleation during the change in state of aggregation. Therefore, the build-up material in the subregion is converted from a first state into a solid second state, and a nucleating agent initiates a preferred crystal orientation which, during the conversion operation, continues in the build-up material of the subregion in such a way that after the conversion operation at least the subregion has the preferred crystal orientation. What this means is that the subregion does not have an isotropic structure, but rather in particular has precisely the same preferred crystal orientation as the other parts of the turbine component.

The build-up material can be supplied in particular as a molten material and therefore in the liquid state as the first state. The casting of a turbine component with a complex geometry is made possible in a particularly simple way yet still with a very low scrap rate, since according to the concept of the invention the turbine component does not have to be produced as a single part, but rather can be joined together from individual castings. The actual casting operation is therefore in each case restricted only to a part of a turbine component. The scrap rate for a part of the turbine component is naturally lower, since the part, e.g. a base part or a build-up part of the build-up material, has smaller dimensions than the turbine component and moreover can be selected in such a way that it can be cast in a favorable way. In this way it is even possible for a complex turbine component to be assembled from parts which are simple to cast.

Refinements to the invention which are advantageous with regard to the process and apparatus are given in the process and apparatus subclaims and provide details of advantageous ways of producing a particularly expedient turbine component.

The process can be carried out particularly easily if the base part is already designed in such a way that it acts as a nucleating agent for the preferred crystal orientation. In this context, by way of example, that surface of the base part which adjoins the subregion can act as a nucleating agent for the preferred crystal orientation. The subregion in this case advantageously has a directionally solidified and/or single crystal structure as the preferred crystal orientation. These structures are the two particularly preferred structures which are realized during an operation of casting a part of the turbine component. On account of the action of the nucleating agent, a directionally solidified and/or single crystal structure also continues in the subregion during the conversion from the first state into the second solid state.

According to a first variant of the process, the process can be used to produce a completely new turbine component. In particular for this first variant, it has proven particularly expedient for the build-up material to be placed onto the base part as a build-up part and for the subregion to form a joining zone which connects the base part and the build-up part. In this context, it may also be expedient for the build-up material to comprise a filler material which is arranged between the build-up part and the base part and assists with the joining of the build-up part and the base part. The filler material is expediently matched to the joining process. It is particularly advantageous for the build-up part to be placed vertically onto the build-up material. It has been found that with this orientation the nucleating agent initiates the preferred crystal orientation in a particularly advantageous way.

In particular when producing a turbine component which is entirely provided with a preferred crystal orientation, it is expedient for the base part and the build-up part to have a directionally solidified and/or single crystal structure as the preferred crystal orientation at least in the region that adjoins the subregion. The base part and the build-up part are advantageously entirely provided with a preferred crystal orientation. The base part does not necessarily have to have a preferred crystal orientation, since it could also provide any other suitable type of nucleating agent and the base part could then be removed again to complete the turbine component. In this case, only the build-up part would have a directionally solidified and/or single crystal structure as the preferred crystal orientation at least in the region which adjoins the subregion.

According to a further variant of the proposed concept, the process for producing the turbine component can also be used, as part of the "refurbishment", to repair a turbine component or to advantageously treat it in some other way, for example to coat it. In particular with this variant, the base part would already be a turbine component, which is either to be coated or repaired and has a directionally solidified and/or single crystal structure as the preferred crystal orientation at least in the region which adjoins the subregion. With this second variant of the proposed concept, a build-up part would at least not always be placed onto the base part, but rather in general one or more layers would be applied to the base part as subregions. Accordingly, the build-up material may be applied to the base part as one or more layers of filler material, in which case the subregion comprises the one or more layers of filler material and a joining zone which connects the base part. With the second variant of the proposed concept explained here, it would be possible for a number of layers to be applied in order to repair a turbine component or treat it in some other way, for example in order to provide it with a coating, with the preferred crystal orientation propagating from a first layer to a second, adjacent layer as a result of the nucleation.

Of course, both variants of the concept explained hitherto can be carried out repeatedly in succession, individually or in combination. According to the first variant of the proposed concept, therefore, it is possible for in each case a plurality of build-up parts to be joined together by a subregion designed as a joining zone between adjacent build-up/base parts, in which case at least the subregion has the preferred crystal orientation. Not all the build-up/base parts necessarily have to have a preferred crystal orientation. However, to produce a turbine component which is completely provided with a preferred crystal orientation, all the parts and subregions have the same preferred crystal orientation. In principle, it is also possible, in a turbine component, for a first preferred crystal orientation and a second preferred crystal orientation, and if appropriate also further preferred crystal orientations, which differ from one another to be provided, in such a manner that they are oriented appropriately for the thermal and mechanical loads acting on the turbine component. For this purpose, it would according be possible to provide base parts having different preferred crystal orientations as nucleating agents which, as a result of the nucleation, initiate the preferred crystal orientation in a subregion and if appropriate also a build-up part.

A combination of the first variant and second variant of the proposed concept as explained above may also be implemented. This proves advantageous in particular in the case of repair to a turbine component if, for example, partial coatings are to be carried out on a turbine component to be repaired—in accordance with the second variant—or a new part is to be fitted to the turbine component—in accordance with the first variant.

In principle, the first state may be any desired solid state or alternatively a liquid or gaseous state. In particular if the conversion takes place from a gaseous state or a liquid state to a solid second state it proves favorable for the conversion to be accelerated by cooling at least the subregion. It is also possible to set further process parameters, for example in terms of temperature and pressure, for the conversion. In this case, in a particularly advantageous refinement, a temperature gradient is established in the direction of the preferred direction which is to be established, so that the formation of the preferred crystal orientation is also promoted simply by the local supply of heat.

Refinements to the process provide for the conversion and application of the build-up material to take place in various ways.

For example, it has proven expedient for the build-up material to be applied as filler material as part of a welding operation and/or a remelting operation, in which case the first state of the filler material is a liquid state. In this case, the welding operation is preferably a build-up welding operation; however, it could also be a remelting operation. These operations are equally advantageous for the application of further parts in accordance with the first variant or simply for the application of further, preferably coated subregions. Laser welding, in particular laser powder build-up welding, has proven particularly advantageous. A subregion is in this case expediently formed as an extended weld pass, which in terms of its extent goes beyond that of a standard weld pass.

In the conventional welding process, weld filler material as well as build-up material is expediently applied as build-up material. On account of the welding operation, at least the subregion with the filler material and advantageously also adjoining regions of the base part are melted and a preferred crystal orientation is initiated in the subregion by a nucleating agent. This means that both the subregion and the adjoining regions of the base part and of the build-up part have the preferred crystal orientation. During the remelting or laser welding, a filler material can if appropriate be dispensed with, so that the base part and build-up part are simply placed against one another. In this case, the build-up part is simply to be understood as being build-up material. During the remelting, the boundary regions of the base part and build-up part which bear against one another are then melted, a preferred crystal orientation is initiated during the conversion from the liquid state to the solid state, so that after the conversion operation at least the subregion of the joining zone has the preferred crystal orientation.

In particular for application of coated subregions, it has proven expedient for the build-up material, in particular filler material, to be applied by laser powder build-up welding. In this method, the build-up material is blown as a powder into a laser beam, where it melts and then passes onto the base part in liquid form.

Alternatively, it would be possible for build-up material, in particular filler material, to be applied as part of a spraying, brushing or dipping operation, in which the first state is a liquid state. The way in which build-up material is applied and converted from the first state to the second state can advantageously be selected for the particular turbine component which is to be produced and according to the choice of build-up material. A further advantageous possibility consists in applying the build-up material, in particular filler material, as a foil, sheet or wire, in which case the first state is a liquid state.

All the refinements to the proposed concept which have been explained thus far can be realized as part of a welding or remelting operation. In this context, it has proven particularly advantageous for the base part to be used as a weld pool backup. The application device for applying build-up material may be a device selected from the group consisting of a welding device, a remelting device and a build-up device.

According to a very particularly preferred refinement of the invention, there is provision for the build-up material and the build-up part to be applied in layers, in which case the first state is a liquid state and in which case layers with a thickness of in each case approximately 0.25 to 0.5 mm are applied in steps. To realize this particularly preferred refinement of the process, it would be possible to provide a single base part or a plurality of base parts, onto which the further body of the turbine component is poured or cast in layers. During the conversion of the poured material from the liquid state to the solid state, the base part acts as a nucleating agent and initiates a preferred crystal orientation in the build-up material, in such a manner that after the poured material has been converted from the liquid state to the solid state, as least the subregion and preferably all the poured material has the preferred crystal orientation of the base part. This operation can be repeated a number of times. It is also possible for a particularly expedient base part to be provided as the nucleating agent. It would also be possible for a base part of this type to be removed again. The options mentioned enable even complex structures of a turbine component to be produced with a low scrap rate by means of one or more application operations.

The process parameters used to convert the poured material into the solid state can be selected appropriately for the conversion. In particular, cooling means are provided in the apparatus.

With regard to the use, the object is achieved by the invention as a result of the apparatus being used in accordance with the invention for producing a new turbine component and/or repairing and/or treating a turbine component. Production of a new turbine component can be implemented either by joining together a plurality of parts or by carrying out at least one casting operation in succession. A turbine component could also be repaired in a similar way. The proposed apparatus can also be used to coat turbine components which have been newly produced or turbine components which are to be repaired. For this purpose, by way of example, a plurality of subregions could be applied in layers to an existing body of a turbine component. This can be carried out in the manner explained above by welding, remelting or epitaxial processes. One or more of the proposed application and conversion processes can be combined with one another to produce a turbine component. For example, it has already been explained that it is possible for one or more castings as build-up parts to be joined together by means of a welding operation, so that a turbine component which is completely provided with a preferred crystal orientation is formed. It would also be possible for a turbine component to be produced substantially by a plurality of casting operations carried out in succession, in which case a preferred crystal orientation which has been predetermined by a base part is initiated during each operation of casting the casting material and ultimately extends over the entire turbine component. It would then be possible for further subregions to be applied to the turbine component in layers with the same preferred crystal orientation or, if desired, with a different preferred crystal orientation. This could be carried out epitaxially or by means of a welding operation.

With regard to the turbine component, the object is achieved by the invention by means of a turbine component which has been produced using the proposed process or a refinement thereof. Furthermore, according to the invention the invention is achieved by a turbine component having at least one subregion, the subregion including build-up material which has been converted from a first state into a solid second state, with initiation of a preferred crystal orientation by a separate nucleating agent, so that after the conversion operation at least the subregion has the preferred crystal orientation. The subregion preferably adjoins a build-up part which has the preferred crystal orientation at least in a region which adjoins the subregion.

According to a refinement of the turbine component, it has likewise proven expedient for the subregion to adjoin a base part which has the preferred crystal orientation at least in a region which adjoins the subregion. In this case, the base part would also be a part of the completed turbine component.

The subregion and/or the base part and/or the build-up material advantageously has a directionally solidified and/or single crystal structure as the preferred crystal orientation. In particular to produce a turbine component which has a preferred crystal orientation substantially in its entirety, it has proven expedient for the turbine component to be composed of a plurality of parts which each entirely have a preferred crystal orientation.

An abovementioned turbine component is expediently designed as a turbine blade or vane, since the concept of the invention has proven particularly advantageous for a turbine blade or vane. In particular a rotor blade, as explained in the introduction, as a rotating turbine component has to be able to withstand high thermal and mechanical loads acting along its axial extent. A single-crystal structure or a directional solidification of the turbine blade or vane in the direction of the axial extent, resulting from a specifically initiated crystalline structure with a preferred orientation, has proven particularly advantageous. A turbine blade or vane of this type can therefore be produced even in complex form and with a low scrap rate.

Exemplary embodiments of the invention will now be described with reference to the drawing, which is not intended to illustrate the exemplary embodiments to scale, but rather the drawing, where appropriate to the explanation being provided, is in schematic and/or slightly distorted form. For further explanation of the teaching which is directly revealed by the drawing, reference is made to the relevant prior art. In this context, it should be borne in mind that numerous modifications and changes can be made in terms of shape and detail of an embodiment without departing from the general idea of the invention. The features of the invention which are disclosed in the above description, in the drawing and in the claims may be pertinent to the invention both individually and also in any desired combination. The general idea of the invention is not restricted to the precise form or detail of the preferred embodiment which is shown and described below and is also not restricted to a subject matter which would be limited by comparison with the subject matter which is claimed in the claims.

BRIEF DESCRIPTION OF THE DRAWINGS

Various processes for producing and assembling a DS/SX turbine blade or vane are described as particularly preferred embodiments of the invention. In detail, in the drawing:

FIG. 1 shows a preferred way of producing an overhanging geometry of a turbine component which cannot be produced or cannot readily be produced by casting in the conventional way but can be produced in a particularly simple way with low scrap rates using the proposed concept;

FIG. 2 shows a further preferred way of producing an overhanging geometry in a turbine component similar to that shown in FIG. 1, but with a base part being removed again to complete the preferred turbine blade or vane;

FIG. 3 shows a preferred way of coating a turbine component, which can be employed both for a newly produced component and for a repair in accordance with the proposed concept.

DETAILED DESCRIPTION OF INVENTION

The text which follows uses two figures to explain, by way of example, how DS/SX blades or vanes are advantageously produced, for example from preformed components. According to the particularly preferred embodiment, assembly of a DS/SX blade or vane can be carried out both for the production of new DS/SX parts or to repair DS/SX parts. According to a first modification, the preformed components can be joined by means of epitaxial growth of DS/SX layers. The DS/SX layer in this case forms a subregion which is designed as a joining zone and, like the preformed DS/SX components, has a DS/SX structure, i.e. a preferred crystal orientation.

According to a second modification, the components can be produced with a preferred crystal orientation by means of DS/SX build-up welding, in particular layered build-up welding, or remelting. In this context, it is possible in particular to make advantageous use of a specific form of welding pool backup. By way of example, it is appropriate to use a weld pool backup which is intended as a base part for presetting a crystallization direction. The weld pool backup is therefore used as a nucleating agent for the materials which are to be applied.

According to yet a further modification, preformed DS/SX components are joined together to produce a DS/SX blade or vane by means of laser welding or a laser-induced remelting, in particular in layers. In this case, the material can be supplied in various ways. By way of example, a second filler material can be sprayed on as build-up material, or a build-up part can be put in place and the joining can then be remelted by laser means. Build-up material can likewise be applied as a powder with or without binder. Moreover, there are various forms of slip coating, for example by brushing, dipping or spraying. In this case too, the remelting or welding operation is advantageously carried out by means of a laser. A further way of applying build-up material consists in putting the build-up material in place in the form of a foil, sheet or wire and then converting it from a first, liquid state into a second, solid state by means of laser spot welding, if appropriate after a build-up part has been put in place. This has the advantage that not all the build-up material has to be melted. If desired, however, it is also possible to carry out a remelting operation.

The abovementioned modifications are all suitable for producing overhanging geometries which it is impossible or difficult to produce by casting. An example of such a geometry is illustrated in FIG. 1. For this purpose, to produce a turbine blade or vane in the anchoring region, a turbine blade or vane part or a turbine component 9 is provided at its anchoring-side end as base part 1. This base part has been produced as an SX casting as part of a casting process and therefore has a preferred crystal orientation 2 which is symbolically illustrated by the parallel lines. The turbine component 9 has a constricted waist at its anchoring-side end. For this purpose, to form the anchoring means, a further, first auxiliary base part 4a and a second auxiliary base part 4b are arranged to the sides of the constricted waist 3. These auxiliary base parts 4a, 4b are also provided with an SX structure which corresponds to the preferred crystal orientation 2 of the base part 1. The auxiliary base parts 4a and 4b are in this case designed as a weld pool backup for a weld pool.

Filler material 5 can be applied to the base part 1 and the auxiliary base parts 4a and 4b by means of one of the modifications described above. Then, a build-up part 6 which is likewise provided with an SX/DS structure as a preferred crystal orientation is applied in the vertical direction. In this embodiment, the filler material 5 and the build-up part 6 form the build-up material 8. In the preferred embodiment of the production process shown in FIG. 1, both the filler material 5 and materials of the build-up part 6 and of the base parts 1, 4a and 4b are then liquefied in a subregion 7 which adjoins the filler material 5, i.e. in a subregion 7 which adjoins the base part 1 and the build-part 6, and are then converted from this first, liquid state into a solid, second state.

The build-up part 6 is in this case applied in particular in layers, with layers of a thickness of, for example, approximately 0.25 to 0.5 mm being applied in successive deposition steps. During the conversion operation, those surfaces of the base part 1 and of the auxiliary base parts 4a and 4b which adjoin the subregion 7 act as nucleating agents, so that during the conversion operation a preferred crystal orientation as an SX structure is initiated in the filler material 5 and in the molten subregion 7, adjoining the filler material 5, of the build-up part 6. After the conversion operation, therefore, the entire subregion 7 which acts as a joining region and at least comprises the region of the filler material 5 has the preferred crystal orientation as an SX structure, i.e. the turbine blade or vane composed of parts 1, 4a, 4b, 5 and 6 has a continuous SX structure throughout, and according to this preferred embodiment this continuous SX structure continues in particular also in the subregion 7 of the filler material 5 and the adjoining regions of the build-up part 6 and the base part 1 and the auxiliary base parts 4a, 4b.

In the preferred embodiment of the production process described here, the auxiliary base part 4a and the auxiliary base part 4b are removed again following the joining operation. In this context, chip-forming removal, for example by turning or milling, has proven particularly advantageous.

FIG. 2a shows a further desired embodiment of a turbine component 10, in the exemplary embodiment a turbine blade or vane, which in the lower region 11 has an overhanging geometry and therefore cannot, at least without difficulty, be produced by casting. Nevertheless, a turbine component 10 of this type can be produced particularly easily, with low scrap rates and with a continuous preferred crystal orientation 12 by means of the production steps which are illustrated below in FIG. 2b and FIG. 2c.

For this purpose, in a similar manner to what has been described above with reference to FIG. 1, in accordance with FIG. 2b in a first production step a first base part 13a and a second base part 13b are provided. Both base parts 13a and 13b likewise have the preferred crystal orientation 12. In a further step, illustrated in FIG. 2c, an auxiliary base part 14 is provided in addition to the base parts 13a and 13b. This auxiliary base part 14 does not necessarily have to have an SX structure. In the case of the present embodiment, it is produced from a composite material which on the one hand is a suitable nucleating agent, but also, on the other hand, can be removed again following the process of producing the structure shown in FIG. 2c in order for the turbine component 10 shown in FIG. 2a then to be completed. Once the base parts 13a, 13b and the auxiliary base part 14 have been provided, in accordance with FIG. 2c a build-up part 15 can be placed vertically onto the base parts 13a, 13b and onto the auxiliary base part 14. In this case, filler material as shown in FIG. 1 is not provided. The build-up part 15 forms the build-up material. In a subregion 16a and 16b, material in the boundary region between the build-up part 15 and the base parts 13a and 13b is melted by means of a joining operation, for example a welding operation. Material of the build-up part 15 in a subregion 16c as the boundary region between build-up part 15 and auxiliary base part 14 and also material of the composite material of the auxiliary base part 14 are likewise melted and then converted from this first, liquid state into a solid, second state. Both the composite material of the auxiliary base part 14 and the SX structure of the base part 13a, 13b in this case act as nucleating agents and initiate a preferred crystal orientation 12 in the subregions 16a, 16b and 16c, so that after the conversion operation the subregions 16a, 16b and 16c and also the build-up part 15 have the preferred crystal orientation 12.

Then, the auxiliary base part 14 is removed, which can be achieved particularly easily by a very wide range of methods in the case of the composite material used. In this way, the turbine component 10 is completed as a turbine part which is provided with a preferred crystal orientation 12 throughout, with an overhanging geometry 11, as illustrated in FIG. 2a.

If the auxiliary base part 14 acts as a nucleating agent (SX/DS structure) and is of L-shaped design and the base of the L shape is secured to the second base part 13, it is also possible for the region 13a to be filled by means of build-up welding. When this has taken place, i.e. when a height of the second base part 13b has been reached, the build-up welding is extended to cover the entire surface of 13b, 14 and 13a. There is therefore no need for a prefabricated part 13a.

The particularly preferred embodiments of a process for producing a DS/SX blade or vane or other turbine component which have been described above with reference to FIGS. 1 and 2 provide for the application of build-up parts. A further preferred embodiment, which may, if appropriate be used in addition to develop the turbine components 9 and 10 described above, relates to the application of layers 16 with a preferred crystal orientation 17 to a blade or vane 18 as a turbine component as shown in FIG. 3. This makes it possible, for example, to produce what are known as gradient blades or vanes. These gradient blades or vanes have a different material composition depending on the location on a blade or vane. By way of example, a blade or vane of this type can be made completely from metal in the anchoring region 20 but can gradually contain more and more ceramic as it extends 21 toward the tip. This can easily be achieved by applying a plurality of layers of subregions 19 which have a preferred crystal orientation 17. FIG. 3 illustrates a single subregion 19 of this type. In this case, the mixture of metal and ceramic changes from layer to layer, in such a manner that the mixture is optimized in terms of the requirements, in particular the thermal and mechanical requirements, imposed at the corresponding location on the blade or vane. In the present case, for example, the proportion of ceramic increases along the extent 21 toward the tip of the blade or vane.

A further preferred way of producing a gradient blade or vane of this type consists, for example, in providing what is known as a blank or powder perform and then applying an MCrAlY covering in layers.

On account of the process used to produce them, the gradient blades or vanes explained above have a material composition which changes gradually from layer to layer. However, it would equally be possible for base parts and build-up parts as have been explained, for example, with reference to FIGS. 1 and 2a to 2c to be optimized in terms of their material composition according to the requirements of each part and then to be joined together in the joining region while maintaining a preferred crystal orientation.

As explained in the description, turbine components have to withstand high thermal and mechanical loads. It has therefore proven advantageous to produce them from a material with a preferred crystal orientation. Hitherto, the turbine components with a preferred crystal orientation have been produced as a single part, with relatively high scrap rates. The proposed concept makes it possible to produce a preferred turbine component 9, 10 in a particularly simple way by a turbine component 9, 10 being assembled at least from a base part 1 and a build-up material 8, with the subregion 7 of the joining zone having a preferred crystal orientation 2, so that disadvantageous properties of a joining zone without a preferred crystal orientation which have hitherto been encountered are avoided.

The processes described above represent just a few significant examples which illustrate how the concept proposed here offers a wide range of possible variations for producing, repairing or treating in some other way even turbine components with a complicated geometry and various material compositions for high thermal and mechanical loads in a particularly simple way and with low scrap rates.

The invention also functions by means of build-up welding (cf. also U.S. Pat. No. 6,024,792), in which first of all the first auxiliary base part and/or the second auxiliary base part 4a, 4b (FIG. 1) or the first base part 13a and auxiliary base part (FIG. 2) are applied to the base part 1 or to the second base part 13b.

This is followed by production of the build-up part 6, 15 by means of build-up welding.

Filler material is not always required.

It is also possible for an SX structure to be built up on a DS structure, and vice versa.

The invention claimed is:

1. A method of producing a part with a continuous preferred crystal orientation extending throughout the part including in an overhanging region of the part, the method comprising:
   providing a base part comprising the preferred crystal orientation;
   disposing an auxiliary base part comprising the preferred crystal orientation laterally beside the base part;
   applying a build-up material as a plurality of layers on top of the base part and the auxiliary base part,
   with the base part and the auxiliary base part acting as nucleating agents effective to create the preferred crystal orientation throughout the build-up material, thereby extending the preferred crystal orientation beyond a lateral side of the base part to define the overhanging region having the preferred crystal orientation; and
   removing the auxiliary base part to reveal the overhang region.

2. A method of producing a part with a continuous preferred crystal orientation extending throughout the part including in a laterally overhanging region of the part, the method comprising:
   providing a first base part and a second base part each comprising the preferred crystal orientation;
   disposing an auxiliary base part between opposed lateral sides of the first and second base parts;
   depositing a build-up material in layers over the first base part, auxiliary base part and second base part;

solidifying each layer of the build-up part with the first and second base parts and the auxiliary base part acting as nucleating agents effective to create the preferred crystal orientation throughout the build-up part, thereby extending the preferred crystal orientation across a region between the opposed lateral sides of the first and second base parts; and removing the auxiliary base part to reveal the part with the continuous preferred crystal orientation extending throughout the part including the laterally overhanging region of the part.

3. The method of claim 2, further comprising providing the auxiliary base part to comprise the preferred crystal orientation.

4. The method of claim 2, further comprising providing the auxiliary base part to comprise a material effective as a nucleating agent but not comprising the preferred crystal orientation.

5. A method of producing an overhanging geometry of a turbine component with a continuous preferred crystal orientation, the method comprising:

providing a base part comprising a preferred crystal orientation extending along a radial length of the base part and comprising lateral sides with no overhanging geometry;

disposing a nucleating agent part along at least one lateral side of the base part;

applying a build up material as a plurality of layers along a top surface of the base part and along a top surface of the nucleating agent part;

solidifying each respective layer of the build up material with the base part and the nucleating agent part acting as nucleating agents effective to extend the preferred crystal orientation into the build up material laterally beyond the at least one lateral side of the base part to define the overhanging geometry of the turbine component with the continuous preferred crystal orientation.

6. The method of claim 5, further comprising providing the nucleating agent part to comprise the preferred crystal orientation.

7. The method of claim 5, further comprising providing the nucleating agent part to comprise a material effective as a nucleating agent but not comprising the preferred crystal orientation.

* * * * *